(12) United States Patent
Bartling

(10) Patent No.: US 8,368,408 B2
(45) Date of Patent: *Feb. 5, 2013

(54) MEASURING A TIME PERIOD

(75) Inventor: James E. Bartling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,214

(22) Filed: Apr. 4, 2011

(65) Prior Publication Data

US 2011/0178767 A1    Jul. 21, 2011

Related U.S. Application Data

(60) Continuation of application No. 12/115,672, filed on May 6, 2008, now Pat. No. 8,022,714, and a division of application No. 11/622,947, filed on Jan. 12, 2007, now Pat. No. 7,460,441.

(51) Int. Cl.
*G01R 27/26* (2006.01)
(52) U.S. Cl. ......................... 324/678; 324/686
(58) Field of Classification Search ............... 324/76.11, 324/678, 713, 686
See application file for complete search history.

(56) References Cited

U.S. PATENT DOCUMENTS

| | | | |
|---|---|---|---|
| 3,663,885 A | 5/1972 | Stewart | 327/48 |
| 4,301,360 A | 11/1981 | Blair | 377/20 |
| 4,504,155 A | 3/1985 | Ruggieri | 368/121 |
| 4,772,843 A | 9/1988 | Asaka et al. | 320/1 |
| 4,870,629 A | 9/1989 | Swerlein et al. | 368/120 |
| 4,908,784 A | 3/1990 | Box et al. | 364/569 |
| 5,091,771 A | 2/1992 | Bolan et al. | 361/751 |
| 5,200,933 A | 4/1993 | Thornton et al. | 368/113 |
| 5,589,802 A | 12/1996 | O'Shaughnessy et al. | 331/44 |
| 5,790,480 A * | 8/1998 | Klatser | 368/121 |
| 6,137,749 A | 10/2000 | Summer | 368/113 |
| 6,327,223 B1 | 12/2001 | Elfman | 368/113 |
| 6,621,767 B1 | 9/2003 | Kattan | 368/113 |
| 6,624,640 B2 | 9/2003 | Lund et al. | 324/678 |
| 6,654,898 B1 | 11/2003 | Bailey et al. | |

(Continued)

FOREIGN PATENT DOCUMENTS

| | | |
|---|---|---|
| EP | 1710967 A2 | 10/2006 |
| EP | 1793551 A2 | 6/2007 |
| WO | 98/40693 | 9/1998 |

OTHER PUBLICATIONS

Invitation to Pay Additional Fees and, Where Applicable, Protest Fee for applicaton No. PCT/US2008/050563, 7 pages, May 7, 2008.

(Continued)

*Primary Examiner* — Amy He
(74) *Attorney, Agent, or Firm* — King & Spalding L.L.P.

(57) ABSTRACT

A time period of an event is determined by charging a known value capacitor from a constant current source during the event. The resultant voltage on the capacitor is proportional to the event time period and may be calculated from the resultant voltage and known capacitance value. Capacitance is measured by charging a capacitor from a constant current source during a known time period. The resultant voltage on the capacitor is proportional to the capacitance thereof and may be calculated from the resultant voltage and known time period. A long time period event may be measured by charging a first capacitor at the start of the event and a second capacitor at the end of the event, while counting clock times therebetween. Delay of an event is done by charging voltages on first and second capacitors at beginning and end of event, while comparing voltages thereon with a reference voltage.

27 Claims, 7 Drawing Sheets

U.S. PATENT DOCUMENTS

| | | | |
|---|---|---|---|
| 6,909,672 B2 | 6/2005 | Rao | 368/251 |
| 6,924,760 B1 | 8/2005 | McLeod et al. | 341/144 |
| 7,058,827 B2 | 6/2006 | Rose et al. | |
| 7,312,616 B2 | 12/2007 | Snyder | 324/658 |
| 2002/0140438 A1 | 10/2002 | Lund et al. | 324/678 |
| 2006/0091907 A1 | 5/2006 | Khan | |
| 2009/0168849 A1 | 7/2009 | Rouxel | 375/140 |

OTHER PUBLICATIONS

International PCT Search Report and Written Opinion, PCT/US2008/050563, 16 pages, Mailed Jul. 22, 2008.

First Office Action of China's State Intellectual Property Office with English translation, Chinese Patent Application No. 200880001899.1, 5 pages, Mar. 22, 2011.

Second Office Action of China's State Intellectual Property Office with English translation, Chinese Patent Application No. 200880001899.1, 5 pages, Apr. 27, 2012.

International PCT Search Report and Written Opinion, PCT/US2011/066523, 11 pages, Apr. 3, 2012.

\* cited by examiner

MEASURING A TIME PERIOD

RELATED PATENT AND PATENT APPLICATION

This application is a continuation of commonly owned U.S. patent application Ser. No. 12/115,672; filed May 6, 2008 now U.S. Pat. No. 8,022,714; entitled "Capacitance Measurement Apparatus" (as amended), by James E. Bartling; and is a divisional application of commonly owned U.S. patent application Ser. No. 11/622,947; filed Jan. 12, 2007; now U.S. Pat. No. 7,460,441 B2; issued Dec. 2, 2008; entitled "Measuring a Long Time Period" (as amended), by James E. Bartling; wherein priority is claimed to both and both are hereby incorporated by reference herein for all purposes.

TECHNICAL FIELD

The present disclosure relates to measurement of time and/or capacitance, and more particularly, to very precise and high resolution measurement of time and/or capacitance by measuring a precisely generated analog voltage over a know time period.

BACKGROUND

Time measurements with digital logic require clocks running at ultra-high frequencies in order to precisely measure the time of events having very short time periods, e.g., 100 picoseconds. Clocks running at ultra-high frequencies, e.g., 1-10 GHz, driving logic capable of running at about 1 GHz, would require a great deal of power to run the clock and logic circuits, and, in addition, the clock and digital logic circuits operating at these clock speeds would generate a great deal of circuit noise.

SUMMARY

Therefore there is a need for a way to very precisely measure the time period of an event and/or capacitance value without having to resort to ultra-high frequency clocks and high power consuming digital logic. According to the teachings of this disclosure, a system, method and apparatus for providing very high resolution time and/or capacitance measurements. The time measurement may resolve time to picoseconds resolution, only dependent upon the frequency accuracy of a time base reference and the resolution of an analog-to-digital converter (ADC), e.g., 8, 10 or 12 bits. For example, a 100 nanosecond range may have a resolution of 0.1 nanosecond, a 1000 nanosecond range may have a resolution of 1 nanosecond, a 10,000 nanosecond range may have a resolution of 10 nanosecond, and a 50,000 nanosecond range may have a resolution of 50 nanosecond, etc. With two time measurement units, dynamic time measurement range may extended to better then one (1) part per million (ppm). The capacitance measurement feature may be beneficially used as a capacitive switch sensor in addition to measurement of capacitance values of capacitors. Also this may be accomplished with low clock speed (less digital noise) and low power (extended battery operation) circuit implementations.

According to a specific example embodiment of this disclosure, an apparatus for measuring a time period may comprise: a constant current source; a current steering switch coupled to the constant current source; a capacitor coupled to the current steering switch, the capacitor having a known value of capacitance, wherein a voltage on the capacitor increases substantially linearly in time when the current steering switch couples the constant current source to the capacitor; a circuit for controlling the current steering switch, wherein the current steering switch couples the capacitor to the constant current source when the circuit detects a start of an event and decouples the capacitor from the constant current source when the circuit detects an end of the event; an analog-to-digital converter (ADC) for converting the voltage on the capacitor to a digital representation thereof; and a digital processor for converting the digital representation of the voltage on the capacitor to a time value representative of a time period between the start and the end of the event. The digital processor may calculate the time period of the event from the known value of capacitance and the digital representation of the voltage.

According to another specific example embodiment of this disclosure, a method for measuring a time period may comprise the steps of: providing a constant current source; providing a capacitor having a known value of capacitance; charging the capacitor having the known value of capacitance from the constant current source when a start of an event is detected; converting a voltage on the capacitor to a digital representation thereof when an end of the event is detected; and converting the digital representation of the voltage to a time value representative of a time period between the start and the end of the event. The step of converting the digital representation of the voltage to a time value may comprise the step of calculating the time period of the event from the known value of capacitance and the digital representation of the voltage on the capacitor at the end of the event.

According to yet another specific example embodiment of this disclosure, an apparatus for measuring capacitance may comprise: a constant current source; a current steering switch coupled to the constant current source; a capacitor coupled to the current steering switch, the capacitor having an unknown value of capacitance, wherein a voltage on the capacitor increases substantially linearly in time when the current steering switch couples the constant current source to the capacitor; a circuit for controlling the current steering switch, wherein the current steering switch couples the capacitor to the constant current source when the circuit detects a start of a known time period of a clock and decouples the capacitor from the constant current source when the circuit detects an end of the known time period of the clock; an analog-to-digital converter (ADC) for converting the voltage on the capacitor to a digital representation thereof; and a digital processor for converting the digital representation of the voltage to a capacitance value. The digital processor may calculate the capacitance of the unknown value capacitor from the digital representation of the voltage and the known time period of the clock.

According to still another specific example embodiment of this disclosure, a method for measuring a capacitance value may comprise the steps of: providing a constant current source; providing a capacitor having an unknown value of capacitance; closing the current steering switch when detecting a start of a known time period of a clock; charging the capacitor having the unknown value of capacitance from the constant current source when a start of a clock having a known time period is detected; converting a voltage on the capacitor to a digital representation thereof when an end of the clock having the known time period is detected; and converting the digital representation of the voltage to a capacitance value. The step of converting the digital representation of the voltage to the capacitance value may comprise the step of calculating the capacitance value from the digital representation of the voltage and the known time period of the clock.

According to another specific example embodiment of this disclosure, an apparatus for measuring a long time period may comprise: a clock interval counter having a clock input coupled to a system clock, wherein the clock interval counter begins counting system clock cycles after a start of an event and stops counting system clock cycles after an end of the event; a first time measurement unit comprising: a first constant current source; a first current steering switch coupled to the first constant current source; a first capacitor coupled to the first current steering switch, the first capacitor having a known value of capacitance, wherein a first voltage on the first capacitor increases substantially linearly in time when the first current steering switch couples the first constant current source to the first capacitor; a first circuit for controlling the first current steering switch, wherein the first current steering switch couples the first capacitor to the first constant current source when the first circuit detects the start of the event and decouples the first capacitor from the first constant current source when the first circuit detects the system clock cycle occurring after the start of the event; a second time measurement unit comprising: a second constant current source; a second current steering switch coupled to the second constant current source; a second capacitor coupled to the second current steering switch, the second capacitor having a known value of capacitance, wherein a second voltage on the second capacitor increases substantially linearly in time when the second current steering switch couples the second constant current source to the second capacitor; a second circuit for controlling the second current steering switch, wherein the second current steering switch couples the second capacitor to the second constant current source when the second circuit detects the end of the event and decouples the second capacitor from the second constant current source when the second circuit detects the system clock cycle occurring after the end of the event; an analog-to-digital converter (ADC) for converting the first and second voltages to first and second digital representations, respectively, thereof; and a digital processor, wherein the digital processor converts the first and second digital representations of the first and second voltages, respectively, to first and second time values, respectively, reads the count of the system clock cycles from the clock interval counter, converts the count of the system clock cycles to a third time value, adds the first time value to the third time value, and subtracts the second time value from the sum of the first and third time values in determining a time period of the event. The digital processor may calculate the first and second time values from the known values of capacitance of the first and second capacitors and the first and second digital representations of the first and second voltages, respectively.

According to another specific example embodiment of this disclosure, a method for measuring a long time period may comprise the steps of: determining a third time value, comprising the steps of: counting system clock cycles after a start of an event and until an end of the event, and multiplying a time interval of the system clock by a number of system clock cycles counted to determine the third time value; determining a first time value, comprising the steps of: providing a first constant current source; providing a first capacitor having a known value of capacitance; charging the first capacitor having the known value of capacitance from the first constant current source when the start of the event is detected; converting a first voltage on the first capacitor to a first digital representation thereof when the system clock cycle occurring after the start of the event is detected; and converting the first digital representation of the first voltage to the first time value, wherein the first time value is representative of a first time period between the start of the event and the system clock cycle occurring after the start of the event; determining a second time value, comprising the steps of: providing a second constant current source; providing a second capacitor having a known value of capacitance; charging the second capacitor having the known value of capacitance from the second constant current source when the end of the event is detected; converting the second voltage on the second capacitor to a second digital representation thereof when the system clock cycle occurring after the end of the event is detected; and converting the second digital representation of the sampled second voltage to the second time value, wherein the second time value is representative of a second time period between the end of the event and the system clock cycle occurring after the end of the event; and determining a time period of the event, comprising the steps of: adding the first and third time values; and subtracting the second time value from the sum of the first and third time values. The steps of converting the digital representations of the sampled first and second voltages to the first and second time values may comprise the steps of calculating the first and second time values from the known values of capacitance and the first and second digital representations of the first and second voltages, respectively.

According to another specific example embodiment of this disclosure, an apparatus for generating a time delayed event may comprise: a first time measurement unit comprising: a first constant current source; a first current steering switch coupled to the first constant current source; a first capacitor coupled to the first current steering switch, the first capacitor having a known value of capacitance, wherein a first voltage on the first capacitor increases substantially linearly in time when the first current steering switch couples the first constant current source to the first capacitor; a first circuit for controlling the first current steering switch, wherein the first current steering switch couples the first capacitor to the first constant current source when the first circuit detects a start of an event; a second time measurement unit comprising: a second constant current source; a second current steering switch coupled to the second constant current source; a second capacitor coupled to the second current steering switch, the second capacitor having a known value of capacitance, wherein a second voltage on the second capacitor increases substantially linearly in time when the second current steering switch couples the second constant current source to the second capacitor; a second circuit for controlling the second current steering switch, wherein the second current steering switch couples the second capacitor to the second constant current source when the second circuit detects an end of the event; a first analog comparator having a positive input for receiving the first voltage and a negative input for receiving a first reference voltage; and a second analog comparator having a negative input for receiving the second voltage and a positive input for receiving a second reference voltage; wherein a start of a delayed event occurs when the first voltage is equal to or greater than the first reference voltage, and an end of the delayed event occurs when the second voltage is equal to or greater than the second reference voltage.

According to still another specific example embodiment of this disclosure, a method for generating a time delayed event may comprise the steps of: starting a time delayed event, comprising the steps of: providing a first constant current source; providing a first capacitor having a known value of capacitance; closing the first current steering switch; charging the first capacitor from the first constant current source when a start of an event is detected; comparing a first voltage on the first capacitor with a first reference voltage; and starting the time delayed event when the first voltage is equal to or greater than the first reference voltage; and ending the time delayed event, comprising the steps of: providing a second constant current source; providing a second capacitor having a known value of capacitance; charging the second capacitor from the second constant current source when an end of the event is detected; comparing a second voltage on the second capacitor with a second reference voltage; and ending the time delayed event when the second voltage is equal to or greater than the second reference voltage.

BRIEF DESCRIPTION OF THE DRAWINGS

A more complete understanding of the present disclosure thereof may be acquired by referring to the following description taken in conjunction with the accompanying drawings wherein.

Figure 1:
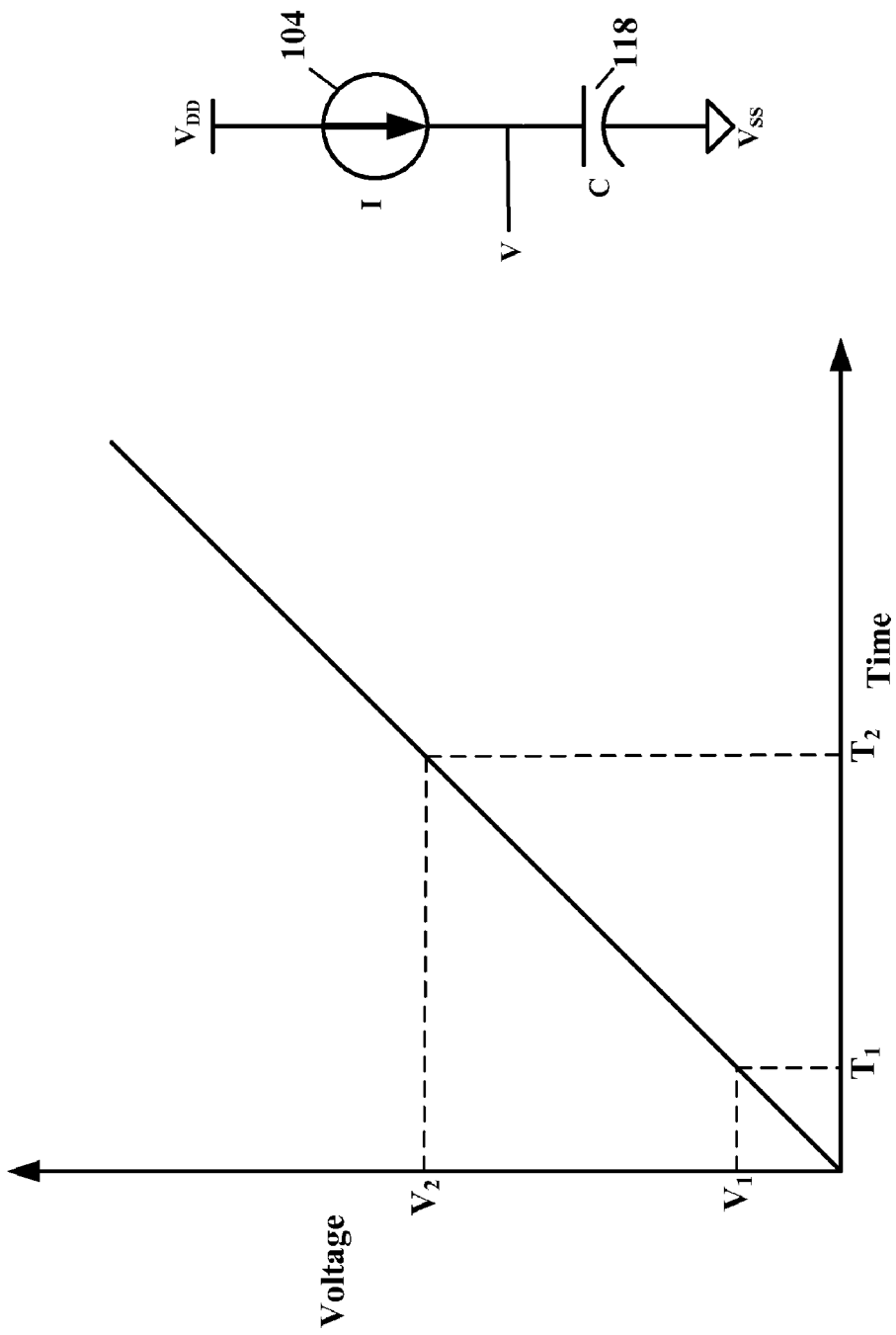
FIG. 1 is a time-voltage graph of a capacitor being charged from a constant current source.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a time-voltage graph of a capacitor being charged from a constant current source. When a capacitor 118 is charged through a constant current source 104, the voltage, V, across the capacitor 118 increases linearly with time, according to equation (1):

$$I = C * dV/dT \quad \text{Eq. (1)}$$

where C is the capacitance value of the capacitor 118, I is the current from the constant current source 104 and V is the voltage on the capacitor 118 at time T. When any two values of the current, I; time, T; and voltage, V are known, the other unknown value may be calculated from the two known values. For example, if the capacitance of the capacitor 118 and the charging current from the constant current source 104 are known, then the time $T_1$ at voltage $V_1$ and the time $T_2$ at voltage $V_2$ may be determined. In a similar fashion, if voltages $V_1$ and $V_2$ (e.g., the voltage difference between $V_1$ and $V_2$) and the elapsed time between times $T_1$ and $T_2$ are known then capacitance, C, may be determined.

Figure 2:
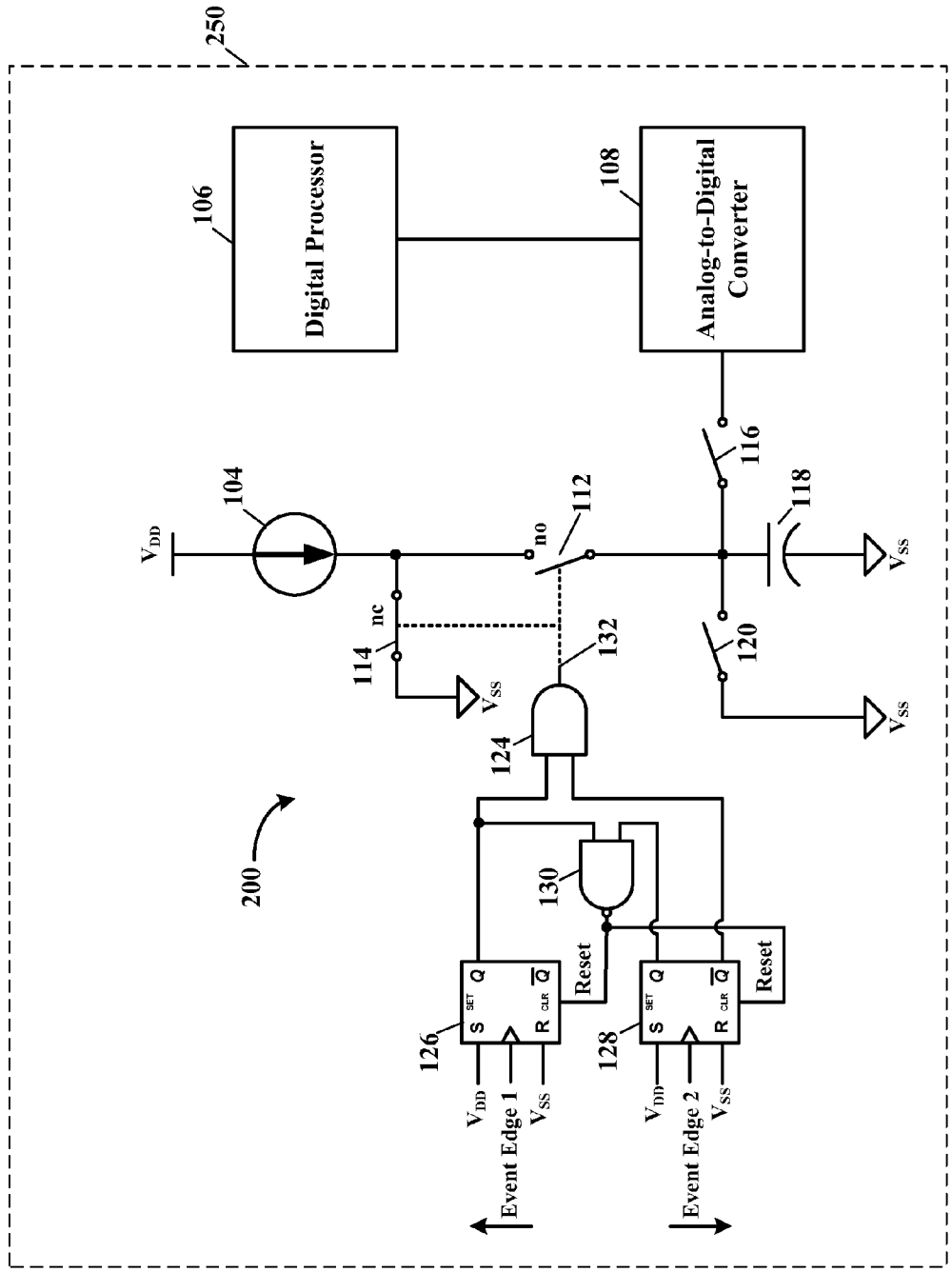
FIG. 2 is a schematic diagram of a high resolution time period measurement circuit, according to a specific example embodiment of this disclosure.

Referring now to FIG. 2, depicted is a schematic diagram of a high resolution time period measurement circuit, according to a specific example embodiment of this disclosure. The high resolution time measurement circuit, generally represented by the numeral 200, may comprise a constant current source 104, current steering switches 112 and 114, a capacitor 118, an optional voltage sample switch 116, and a charge drain switch 120. The capacitor 118 may be initialized to substantially zero charge by closing the charge drain switch 120 so that any charge (voltage) on the capacitor 118 is removed (shorted to ground or common, $V_{SS}$). An initial charge (voltage) on the capacitor 118 may also be determined by sampling that voltage with an analog-to-digital converter (ADC) 108, e.g., sigma-delta, by closing the voltage sample switch 116. The capacitor 118 may be part of a switched capacitor successive approximation analog-to-digital converter wherein the voltage sample switch 116 is unnecessary.

The current steering switches 112 and 114 may be field effect transistors and the like, integrated onto an integrated circuit substrate (not shown) that may also contain other digital logic and analog circuits discussed more fully herein. The current steering switches 112 and 114 are configured so that the constant current source 104 always sees a load, i.e., when switch 114 is closed and switch 112 is open the constant current source 104 is coupled to common, $V_{SS}$, and when switch 112 is closed and switch 114 is open the constant current source 104 is coupled to the capacitor 118 from. The current steering switches 112 and 114 may be controlled from a start/stop control signal 132. For example, when the start/stop control signal 132 is at a logic "0" (low) the switch 114 is closed and the switch 112 is open, or when the start/stop control signal 132 is at a logic "1" (high) the switch 114 is open and the switch 112 is closed. The constant current source 104 charges the capacitor 118 to a voltage value directly dependent upon the length of time that the current steering switch 112 is closed as determined by equation 1 hereinabove.

The start/stop control signal 132 may go to a logic 1 upon the occurrence of a positive (e.g., logic 0 to logic 1) transition (e.g., ↑ Event Edge 1) at the beginning (start) of an event for which a time period is to be determined. The capacitor 118 will be charged by the constant current source 104 until the current steering switch 112 is opened by the start/stop control signal 132 going back to a logic 0 upon the occurrence of a negative (e.g., logic 1 to logic 0) transition (e.g., ↓ Event Edge 2) at the end of the event for which the time period is to be determined.

The start/stop control signal 132 may be generated with a logic circuit comprising a first flip-flop 126, a second flip-flop 128, an AND gate 124 and a NAND gate 130. Prior to the event occurring, the first and second flip-flops 126 and 128 have been reset so that the Q-outputs are at a logic 0 (the first and second flip-flops 126 and 128 are reset when the output of the NAND gate 130 goes to a logic 0 or through other external reset, e.g., by the digital processor 106). These Q-outputs, being at logic 0, cause the AND gate 124 output to be at a logic 0. The output of the AND gate 124 generates the start/stop control signal 132. When the ↑ Event Edge 1 occurs at the clock input of the first flip-flop 126, the Q-output thereof goes to a logic 1. Since the Q-not output of the second flip-flop 128 is also at a logic 1, the output of the AND gate 124 will go to a logic 1, thus generating a logic 1 for the start/stop control signal 132.

When the start/stop control signal 132 is at a logic 1, the current steering switch 112 closes (turns on) and the constant current source 104 begins charging the capacitor 118. The constant current source 104 continues charging the capacitor 118 until the start/stop control signal 132 goes back to a logic 0, thereby opening (turning off) the current steering switch 112. In this specific example, the output of the AND gate 124 (i.e., start/stop control signal 132) will go to a logic 0 when one or more of its inputs is at a logic 0. A logic 0 at an input of the AND gate 124 occurs when ↓ Event Edge 2 occurs at the clock input of the second flip-flop 128. Thus the capacitor 118 only charges between the occurrences of ↑ Event Edge 1 and ↓ Event Edge 2.

By measuring the voltage on the capacitor 118 with an analog-to-digital converter (ADC) 108 after the ↓ Event Edge 2, a voltage representative of the time interval (period) between the ↑ Event Edge 1 and the ↓ Event Edge 2 may be used in combination with the known capacitance value of the capacitor 118 to calculate the time interval with very precise resolution. For example, calculation of the event time period may be determined with a digital processor 106 performing the calculations of Eq. (1) hereinabove by using the measured voltage on the capacitor 118 and the known capacitance value thereof. Thus the time period measurement precision is a function of the ADC 108 resolution, e.g., 10 or 12 bits, and the accuracy of the measured capacitance of the capacitor 118.

The charge drain switch 120 and the voltage sample switch 116 are merely for standard sample and hold operations wherein the capacitor 118 may be part of the sample and hold circuit feeding a sampled analog voltage to the analog input of the ADC 108, or may be part of a successive approximation ADC. The high resolution time period measurement circuit 200, ADC 108 and digital processor 106 may be fabricated on an integrated circuit die 250, and the integrated circuit die 250 may be enclosed in an integrated circuit package (not shown).

Figure 3:
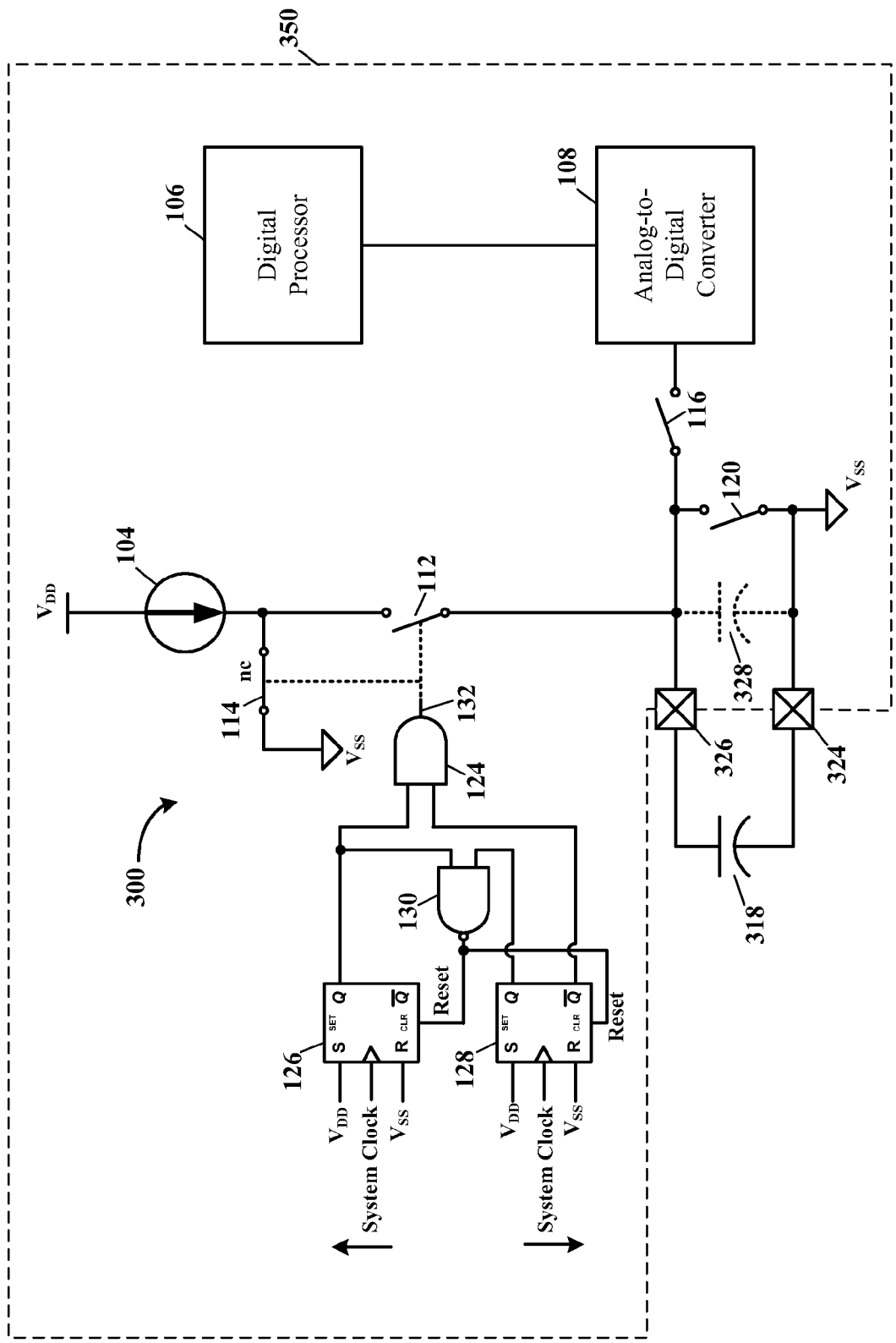
FIG. 3 is a schematic diagram of a high resolution capacitance measurement circuit, according to another specific example embodiment of this disclosure.

Referring now to FIG. 3, depicted is a schematic diagram of a high resolution capacitance measurement circuit, according to another specific example embodiment of this disclosure. The high resolution capacitance measurement circuit, generally represented by the numeral 300, may comprise a constant current source 104, current steering switches 112 and 114, an optional voltage sample switch 116, a charge drain switch 120, and connection terminals 326 and 324 for coupling to an external capacitor 318 to be measured. A charge on the external capacitor 318 may be initialized to substantially zero by closing the charge drain switch 120 so that any charge (voltage) on the external capacitor 318 is removed (shorted to ground or common, $V_{SS}$). An initial charge (voltage) on the external capacitor 318 may also be determined by sampling that voltage with an analog-to-digital converter (ADC) 108, e.g., sigma-delta, by closing the voltage sample switch 116. A capacitor 328 represents stray circuit capacitance of the high resolution capacitance measurement circuit 300, its capacitance contribution may be determined and factored out when calculating the capacitance value of the external capacitor 318. The capacitor 328 may be part of a switched capacitor successive approximation analog-to-digital converter wherein the voltage sample switch 116 is unnecessary.

The current steering switches 112 and 114 may be a field effect transistors and the like, integrated onto an integrated circuit substrate (not shown) that may also contain other digital logic and analog circuits discussed more fully herein. The current steering switches 112 and 114 are configured so that the constant current source 104 always sees a load, i.e., when switch 114 is closed and switch 112 is open the constant current source 104 is coupled to common, $V_{SS}$, and when switch 112 is closed and switch 114 is open the constant current source 104 is coupled to the capacitor 118 from. The current steering switches 112 and 114 may be controlled from a start/stop control signal 132. For example, when the start/stop control signal 132 is at a logic "0" (low) the switch 114 is closed and the switch 112 is open, or when the start/stop control signal 132 is at a logic "1" (high) the switch 114 is open and the switch 112 is closed. The constant current source 104 charges capacitors 318 and 328 to a voltage value directly dependent upon the length of time that the current steering switch 112 is closed as determined by equation 1 hereinabove.

The start/stop control signal 132 may go to a logic 1 upon the occurrence of a positive (e.g., logic 0 to logic 1) transition (e.g., ↑ System Clock). The capacitors 318 and 328 will be charged by the constant current source 104 until the current steering switch 112 is opened by the start/stop control signal 132 going back to a logic 0 upon the occurrence of a negative (e.g., logic 1 to logic 0) transition (e.g., ↓ System Clock).

The start/stop control signal 132 may be generated with a logic circuit comprising a first flip-flop 126, a second flip-flop 128, an AND gate 124 and a NAND gate 130. Prior to ↑ System Clock, the first and second flip-flops 126 and 128 have been reset so that the Q-outputs are at a logic 0 (the first and second flip-flops 126 and 128 are reset when the output of the NAND gate 130 goes to a logic 0 or through other external reset, e.g., by the digital processor 106). These Q-outputs being at logic 0 cause the AND gate 124 output to be at a logic 0. The output of the AND gate 124 generates the start/stop control signal 132. When the ↑ System Clock occurs at the clock input of the first flip-flop 126, the Q-output thereof goes to a logic 1. Since the Q-not output of the second flip-flop 128 is also at a logic 1, the output of the AND gate 124 will go to a logic 1, thus generating a logic 1 for the start/stop control signal 132.

When the start/stop control signal 132 is at a logic 1, the current steering switch 112 closes (turns on) and the constant current source 104 begins charging the capacitors 318 and 328. The constant current source 104 continues charging the capacitors 318 and 328 until the start/stop control signal 132 goes back to a logic 0, thereby opening (turning off) the current steering switch 112. In this specific example, the output of the AND gate 124 (i.e., start/stop control signal 132) will go to a logic 0 when one or more of its inputs is at a logic 0. A logic 0 at an input of the AND gate 124 occurs when ↓ System Clock occurs at the clock input of the second flip-flop 128. Thus the capacitors 318 and 328 only charge over a time period between ↑ System Clock and ↓ System Clock. The system clock frequency (i.e., periods between ↑ System Clock and ↓ System Clock) may be generated from a highly stable and accurate crystal oscillator.

By measuring the voltage on the capacitors 318 and 328 with an analog-to-digital converter (ADC) 108 after the ↓ System Clock, a voltage representative of the time interval (period) between the ↑ System Clock and ↓ System Clock may be used in combination with the known period (time interval) of the system clock to calculate the capacitance value of the parallel combination of capacitors 318 and 328, then the known capacitance value of the capacitor 328 may be subtracted from this result for the capacitance value of the unknown capacitor 318. For example, calculation of the capacitance value of the unknown capacitor 318 may be determined with a digital processor 106 performing the calculations of Eq. (1) hereinabove by using the measured voltage on the capacitors 318 and 328 and the known system clock period, e.g., time interval between ↑ System Clock and ↓ System Clock. Thus the capacitance measurement precision is a function of the ADC 108 resolution, e.g., 10 or 12 bits, and the accuracy (resolution) of the system clock frequency.

The charge drain switch 120 and the voltage sample switch 116 are merely for standard sample and hold operations wherein the capacitor 328 may be part of the sample and hold circuit feeding a sampled analog voltage to the analog input of the ADC 108, or may be part of a successive approximation ADC. The high resolution capacitance measurement circuit 300, ADC 108 and digital processor 106 may be fabricated on an integrated circuit die 350, and the integrated circuit die 350 may be enclosed in an integrated circuit package (not shown).

It is contemplated and within the scope of this disclosure that the high resolution capacitance measurement circuit 300 may measure the capacitance of a capacitance touch sensor in determining when the capacitance touch sensor has been activated.

Figure 4:
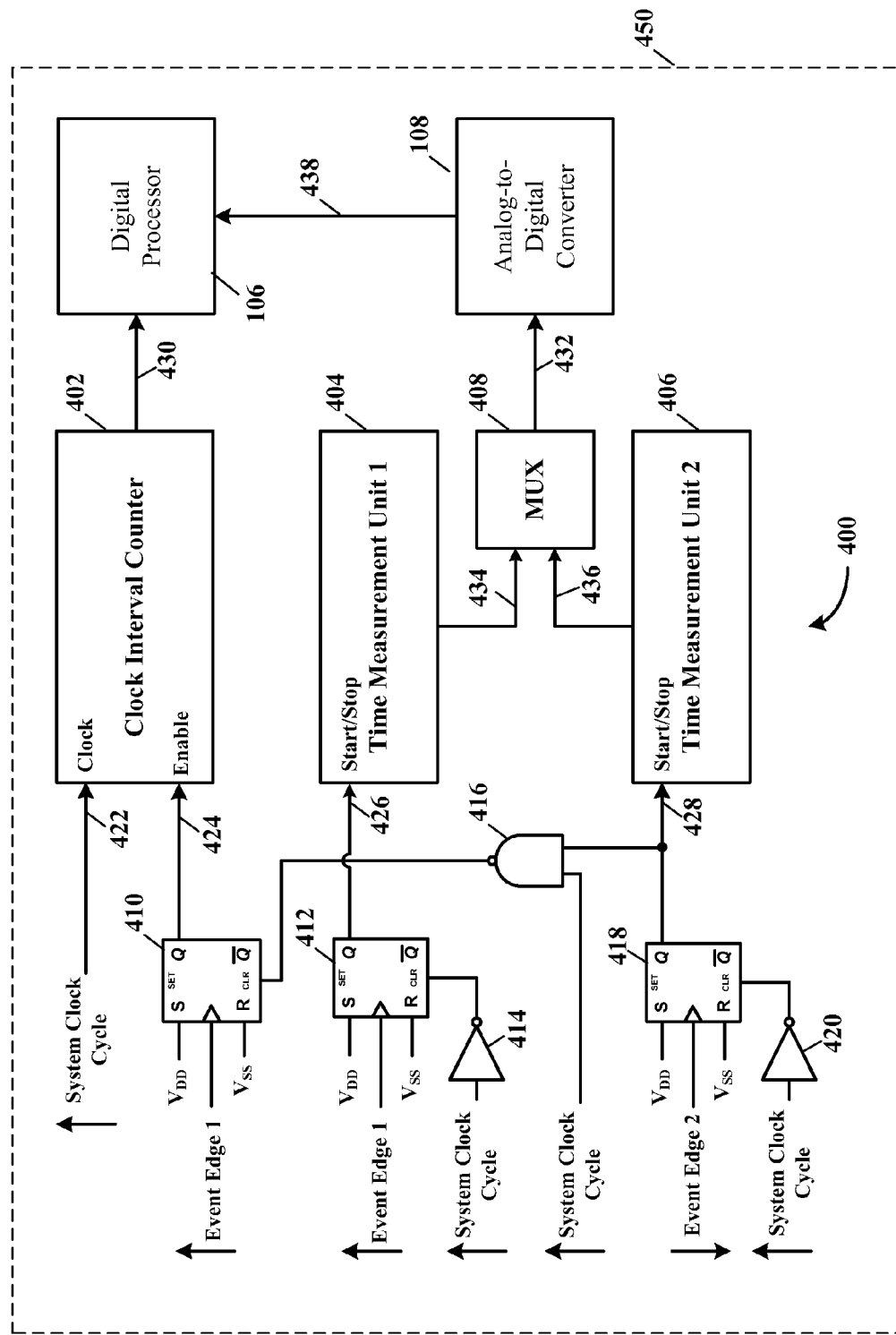
FIG. 4 is a schematic block diagram of a high resolution long time period measurement circuit, according to still another specific example embodiment of this disclosure.
Figure 5:
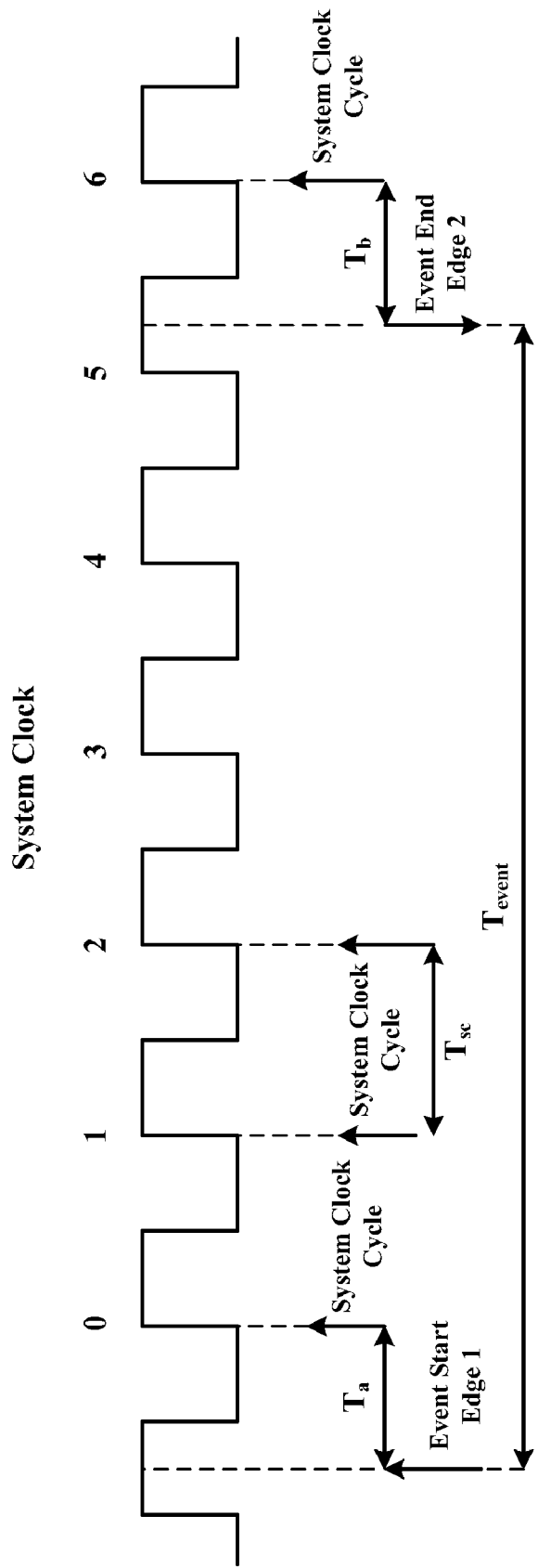
FIG. 5 is a schematic timing diagram of the high resolution long time period measurement circuit of FIG. 4.

Referring now to FIGS. 4 and 5, depicted is a schematic block diagram of a high resolution long time period measurement circuit and a schematic timing diagram of the high resolution long time period measurement circuit of FIG. 4, according to still another specific example embodiment of this disclosure. The high resolution long time period measurement circuit, generally represented by the numeral 400, may comprise a clock interval counter 402, a first time measurement unit 404, a second time measurement unit 406, an analog multiplexer 408, and logic circuits that may comprise flip-flops 410, 412 and 418; inverters 414 and 420 (both may be combined into one inverter), and NAND gate 416. In addition, an analog-to-digital converter (ADC) 108 and digital processor 106 may be used in determining a time period of the long time period measurement. The high resolution long time period measurement circuit 400, ADC 108 and digital processor 106 may be fabricated on an integrated circuit die 450, and the integrated circuit die 450 may be enclosed in an integrated circuit package (not shown).

The first and second measurement units 404 and 406 may operate in substantially the same manner as the high resolution time measurement circuit 200 described hereinabove. Wherein when an ↑ Event Edge 1 is applied to the clock input of the flip-flop 412, the Q-output thereof goes to a logic 1 and generates a logic 1 signal 426 on the start/stop input of the first time measurement unit 404 whereby a first timing capacitor (not shown) begins charging, according to teachings of this disclosure, until the occurrence of a ↓ System Clock Cycle, whereby the flip-flop 412 is reset and signal 426 goes back to a logic 0. This gives a measurement of the time period $T_a$ as shown in FIG. 5. The ↑ Event Edge 1 also enables the clock interval counter 402 when the flip-flop 410 Q-output goes to a logic 1, thereby generating an enable signal 424 on the enable input of the clock interval counter 402. Once the enable input of the clock interval counter 402 is enabled, ↑ System Clock Cycles are counted therein as shown in FIG. 5. When an ↓ Event Edge 2 occurs, the flip-flop 418 Q-output goes to a logic 1 and the second time measurement unit 406 begins charging a second timing capacitor (not shown) until the occurrence of a ↑ System Clock Cycle. This gives a measurement of time period $T_b$ as shown in FIG. 5. Upon the occurrence of the ↑ System Clock Cycle, the second time measurement unit 406 stops charging the second timing capacitor (not shown), and the clock interval counter 402 is no longer enabled and will thereby stop counting ↑ System Clock Cycles.

Inverters 424 and 420 (may be the same inverter—not shown) clear (reset) the flip-flops 412 and 418, respectively, at the occurrence of each ↑ System Clock Cycle. Thus the time periods measured by the first and second time measurement units 402 and 406 are always less than one system clock cycle. However, when combining the resultant calculated high resolution time periods $T_a$ and $T_b$ with the elapsed system clock cycle count from the clock interval counter 402, very long time period events may be measured with very fine resolution, only being dependent upon the frequency stability and accuracy of the system clock oscillator, generally crystal controlled, and the resolution of the ADC 108 in reading the timing voltages on the first and second timing capacitors (not shown).

The clock interval counter output may be coupled to the digital processor 106 over a digital data bus 430. The voltages on the first and second timing capacitors (not shown) may be coupled to the multiplexer 408 via analog signals 434 and 436, respectively. In turn, the multiplexer 408 will couple each of these analog voltages to the ADC 108 via analog signal 432. The output of the ADC 108 may be coupled to the digital processor 106 via a digital data bus 438.

The high resolution long time period measurement circuit 400, ADC 108, analog multiplexer 498 and digital processor 106 may be fabricated on an integrated circuit die (not shown), and the integrated circuit die may be enclosed in an integrated circuit package (not shown).

Referring to FIG. 5, the event time period may be calculated by adding $T_a$ to the cumulative time of the number of system clock cycles, $T_{sc}$, counted by the clock interval counter 402 (six system clock cycles shown) and subtracting $T_b$. Thus the first occurrence of the event is captured by the first measurement unit 404 as time period $T_a$, until the clock interval counter 402 receives a subsequent ↑ System Clock Cycle, then the second measurement unit 406 determines a time period, $T_b$, representing the time period between the end of the event and a subsequent in time ↑ System Clock Cycle. This allows very high resolution measurements of long time period events, according to the teachings of this disclosure.

Figure 6:
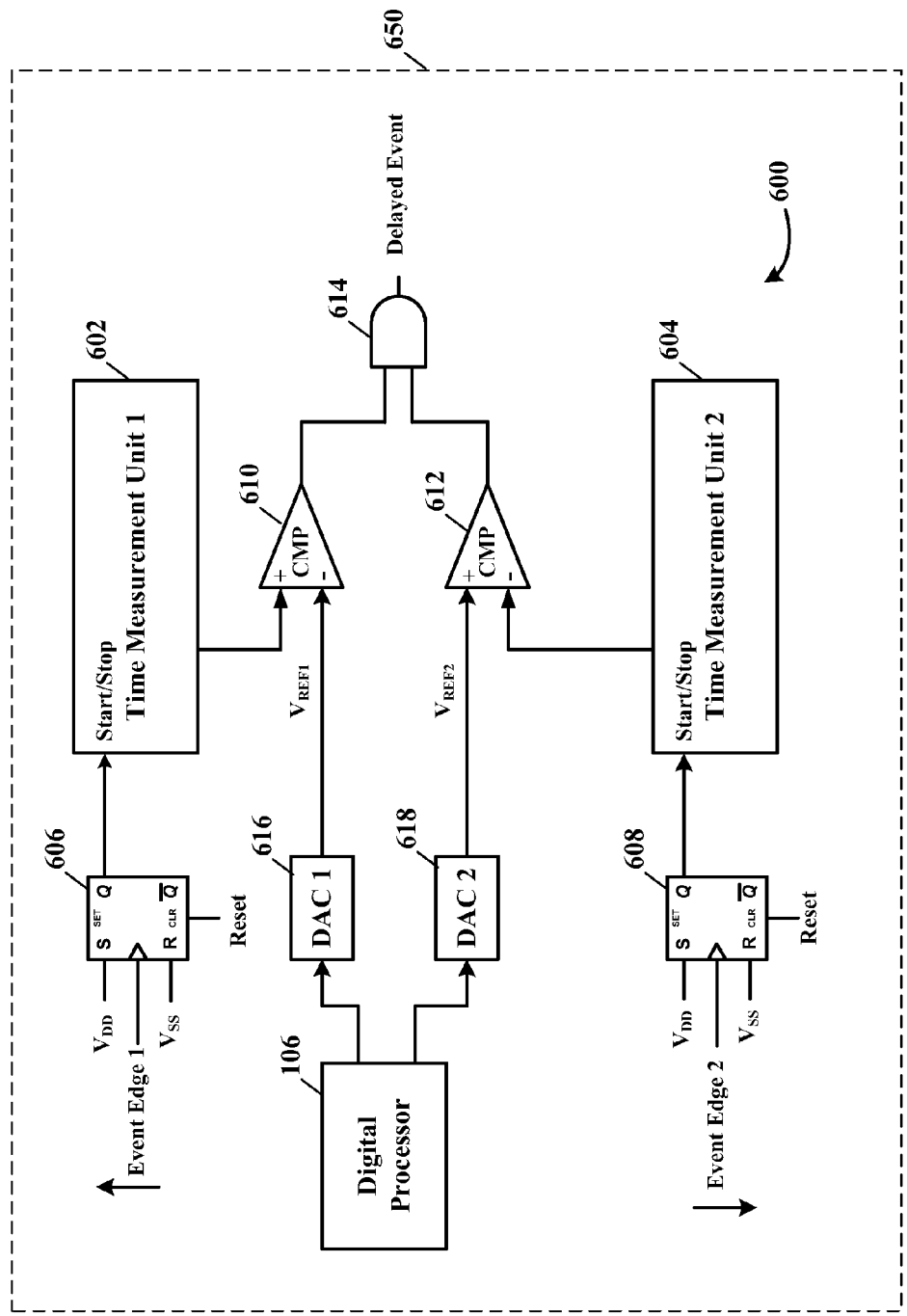
FIG. 6 is a schematic block diagram of a high resolution time delay circuit, according to yet another specific example embodiment of this disclosure.
Figure 7:
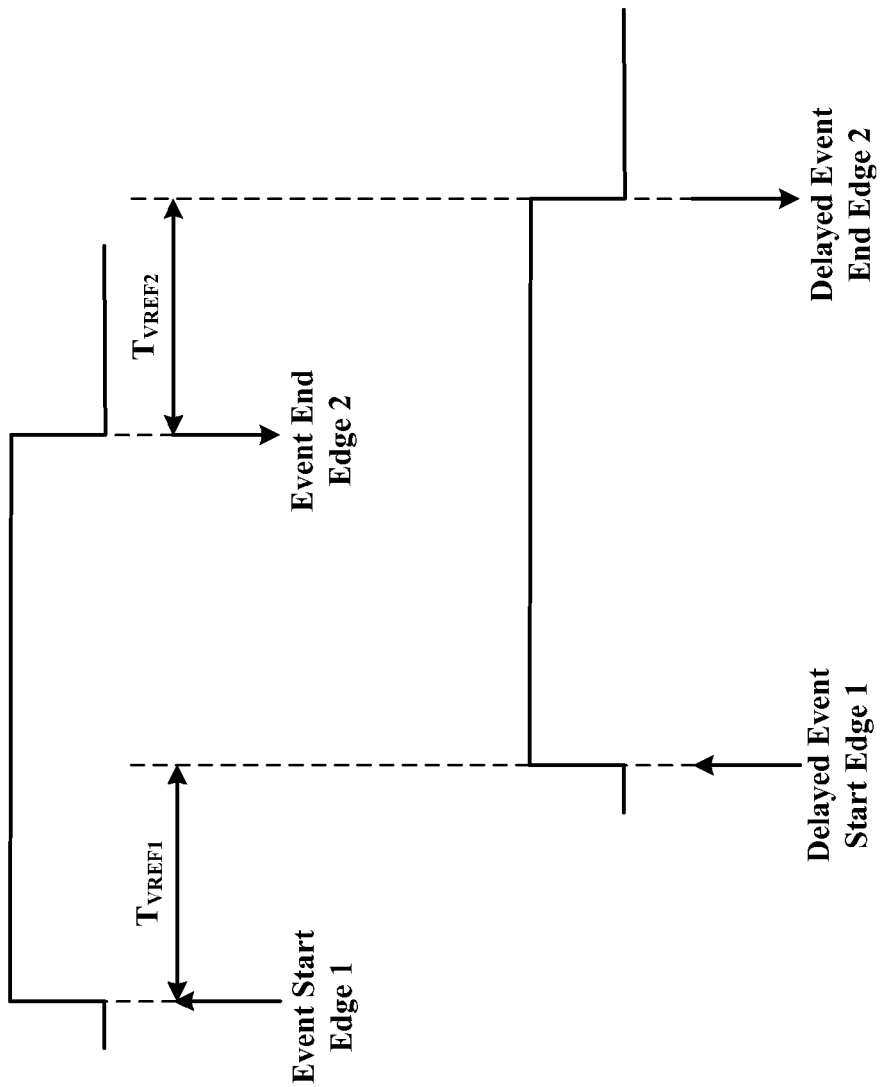
FIG. 7 is a schematic timing diagram of the high resolution time delay circuit of FIG. 6.

Referring now to FIGS. 6 and 7, depicted is a schematic block diagram of a high resolution time delay circuit and a schematic timing diagram of the high resolution time delay circuit of FIG. 6, respectively, according to yet another specific example embodiment of this disclosure. The high resolution time delay circuit, generally represented by the numeral 600, may comprise a first time measurement unit 602, a second time measurement unit 604, a first analog comparator 610, a second analog comparator 612, an AND gate 614, a first digital-to-analog converter (DAC) 616, a second digital-to-analog converter (DAC) 618, and first and second flip-flops 606 and 608. In addition, a digital processor 102 may send digital delay set points to the DACs 616 and 618, according to teachings of this disclosure. The high resolution time delay circuit 600, DACs 616 and 618, and digital processor 106 may be fabricated on an integrated circuit die 650, and the integrated circuit die 650 may be enclosed in an integrated circuit package (not shown).

The first and second time measurement units 602 and 604 may operate in substantially the same manner as the high resolution time measurement circuit 200 described hereinabove. Wherein when an ↑ Event Edge 1 is applied to the clock input of the flip-flop 606, the Q-output thereof goes to a logic 1 and generates a logic 1 signal on the start/stop input of the first time measurement unit 602 whereby a first timing capacitor (not shown) begins charging, according to teachings of this disclosure. An analog input comparator 610 compares the voltage on the first timing capacitor with a first reference voltage, $V_{REF1}$, wherein when the voltage on the first timing capacitor is equal to or greater than the first reference voltage, $V_{REF1}$, an output of the comparator 610 goes to a logic 1, whereby an output of the AND gate 614 goes to a logic 1. The output of the AND gate 614 is a delayed event and the delayed event may be delayed in time from the event by a time equal to $T_{VREF1}$, see FIG. 7. $T_{VREF1}$ is directly proportional to the first reference voltage, $V_{REF1}$, and may be varied in time by changing the value of the reference voltage, $V_{REF1}$.

When an ↓ Event Edge 2 occurs, the flip-flop 608 Q-output goes to a logic 1 and the second time measurement unit 406 begins charging a second timing capacitor (not shown), according to teachings of this disclosure. An analog input comparator 612 compares the voltage on the second timing capacitor with a second reference voltage, $V_{REF2}$, wherein when the voltage on the second timing capacitor is greater than the second reference voltage, $V_{REF2}$, an output of the comparator 612 goes to a logic 0, whereby the output of the AND gate 614 goes to a logic 0. The output of the AND gate 614 is the delayed event and termination of the delayed event may be delayed in time from the end of the event by a time equal to $T_{VREF2}$, see FIG. 7. $T_{VREF2}$ is directly proportional to the second reference voltage, $V_{REF2}$, and may be varied in time by changing the value of the second reference voltage, $V_{REF2}$. The first and second reference voltages, $V_{REF1}$, and $V_{REF2}$, may be the same, e.g., from the same source, thereby producing a delayed event having substantially the same time period as the original event but delayed in time by the delay time, $T_{VREF}$.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for measuring a time period, comprising:
   a constant current source;
   a current steering switch coupled to the constant current source;
   a capacitor coupled to the current steering switch, the capacitor having a known value of capacitance, wherein a voltage on the capacitor increases substantially linearly in time when the current steering switch couples the constant current source to the capacitor;
   a circuit for controlling the current steering switch, wherein the current steering switch couples the capacitor to the constant current source when the circuit detects a start of an event and decouples the capacitor from the constant current source when the circuit detects an end of the event;
   an analog-to-digital converter (ADC) for converting the voltage on the capacitor to a digital representation thereof; and
   a digital processor for converting the digital representation of the voltage on the capacitor to a time value representative of a time period between the start and the end of the event,
   wherein the circuit for controlling the current steering switch, comprises:
   a first flip-flop having a clock input coupled to a first event signal edge indicating the beginning of the event;
   a second flip-flop having a clock input coupled to a second event signal edge indicating the end of the event; and
   an AND gate having a first input coupled to a Q-output of the first flip-flop, a second input coupled to a Q-not output of the second flip-flop and an output coupled to a control input of the current steering switch.

2. The apparatus according to claim 1, wherein the ADC is a successive approximation ADC.

3. The apparatus according to claim 1, wherein the ADC is a sigma-delta ADC.

4. The apparatus according to claim 3, further comprising a voltage sampling circuit for sampling the voltage on the capacitor and coupling the sampled voltage to the sigma-delta ADC.

5. The apparatus according to claim 1, wherein the digital processor calculates the time period of the event from the known value of capacitance and the digital representation of the voltage.

6. The apparatus according to claim 1, wherein the digital processor is a microcontroller.

7. The apparatus according to claim 1, further comprising a NAND gate having a first input coupled to the Q-output of the first flip-flop, a second input coupled to a Q-output of the second flip-flop and an output coupled to reset inputs of the first and second flip-flops.

8. The apparatus according to claim 1, wherein the constant current source, the current steering switch, the capacitor, the circuit for controlling the current steering switch, the ADC and the digital processor are fabricated on an integrated circuit die.

9. The apparatus according to claim 8, wherein the integrated circuit die is enclosed in an integrated circuit package.

10. A method for measuring a time period, said method comprising the steps of:
    providing a constant current source;
    providing a capacitor having a known value of capacitance;
    upon receipt of a first event signal edge setting a first flip-flop having a clock input coupled to the first event signal edge thereby indicating the beginning of an event and upon receipt of a second event signal edge setting a second flip-flop having a clock input coupled to the second event signal edge indicating the end of the event;
    ANDing a Q-output of the first flip-flop and a Q-not output of second flip-flop to control a steering switch for charging the capacitor having the known value of capacitance from the constant current source;
    converting a voltage on the capacitor to a digital representation thereof after the end of the event; and
    converting the digital representation of the voltage to a time value representative of a time period between the start and the end of the event.

11. The method according to claim 10, wherein the step of converting the digital representation of the voltage to a time value comprises the step of calculating the time period of the event from the known value of capacitance and the digital representation of the voltage on the capacitor at the end of the event.

12. A method for measuring a time period, comprising:
    providing a constant current source;
    providing a current steering switch coupled to the constant current source;
    providing a capacitor coupled to the current steering switch, wherein a voltage on the capacitor increases substantially linearly in time when the current steering switch couples the constant current source to the capacitor;
    upon receipt of a first event signal edge setting a first flip-flop having a clock input coupled to the first event signal edge thereby indicating the beginning of an event and upon receipt of a second event signal edge setting a second flip-flop having a clock input coupled to the second event signal edge indicating the end of the event;
ANDing a Q-output of the first flip-flop and a Q-not output of second flip-flop to control the current steering switch to couple the capacitor to the constant current source or to decouple the capacitor from the constant current source;
converting the voltage on the capacitor to a digital representation thereof after receiving the stop signal.

13. The method according to claim 12, further comprising determining a time period between the start and the stop signal from a known value of capacitance and the digital representation of the voltage.

14. The method according to claim 12, further comprising determining a capacitance of the capacitor from a known time period the start and the stop signal and the digital representation of the voltage.

15. The method according to claim 12, wherein the start signal is provided by a rising edge of a first control signal and the stop signal is provided by a falling edge of a second control signal.

16. The method according to claim 12, wherein the start signal is provided by a rising edge of a control signal and the stop signal is provided by a falling edge of the control signal.

17. The method according to claim 12, wherein the start signal is provided by a rising edge of a first control signal and the stop signal is provided by a rising edge of a second control signal.

18. The method according to claim 17, wherein the first control signal is an asynchronous signal the second control signal is a system clock signal.

19. The method according to claim 18, wherein the first control signal is an asynchronous signal the second control signal is a system clock signal.

20. The method according to claim 12, wherein the start signal is provided by a falling edge of a first control signal and the stop signal is provided by a rising edge of a second control signal.

21. An apparatus for measuring a time period, comprising:
a constant current source;
a current steering switch coupled to the constant current source;
a capacitor coupled to the current steering switch, wherein a voltage on the capacitor increases substantially linearly in time when the current steering switch couples the constant current source to the capacitor;
a logic circuit for controlling the current steering switch comprising a first and second input for receiving a start signal and a stop signal, wherein the current steering switch couples the capacitor to the constant current source when the circuit receives the start signal and decouples the capacitor from the constant current source when the circuit receives the stop signal;
an analog-to-digital converter (ADC) for converting the voltage on the capacitor to a digital representation thereof;
wherein the logic circuit for controlling the current steering switch, comprises:
a first flip-flop having a clock input coupled to a first event signal edge forming the start signal;
a second flip-flop having a clock input coupled to a second event signal edge forming the stop signal; and
an AND gate having a first input coupled to a Q-output of the first flip-flop, a second input coupled to a Q-not output of the second flip-flop and an output coupled to a control input of the current steering switch.

22. The apparatus according to claim 21, wherein the start signal is provided by a rising edge of a first control signal and the stop signal is provided by a falling edge of a second control signal.

23. The apparatus according to claim 21, wherein the start signal is provided by a rising edge of a control signal and the stop signal is provided by a falling edge of the control signal.

24. The apparatus according to claim 21, wherein the start signal is provided by a rising edge of a first control signal and the stop signal is provided by a rising edge of a second control signal.

25. The apparatus according to claim 24, wherein the first control signal is an asynchronous signal the second control signal is a system clock signal.

26. The apparatus according to claim 21, wherein the start signal is provided by a falling edge of a first control signal and the stop signal is provided by a rising edge of a second control signal.

27. The apparatus according to claim 26, wherein the first control signal is an asynchronous signal the second control signal is a system clock signal.

* * * * *